(12) United States Patent
Yamada et al.

(10) Patent No.: US 10,699,884 B2
(45) Date of Patent: Jun. 30, 2020

(54) PLASMA PROCESSING APPARATUS AND PLASMA PROCESSING METHOD

(71) Applicant: HITACHI HIGH-TECH CORPORATION, Minato-ku, Tokyo (JP)

(72) Inventors: Kazuya Yamada, Tokyo (JP); Koichi Yamamoto, Tokyo (JP); Naoki Yasui, Tokyo (JP); Norihiko Ikeda, Tokyo (JP); Isao Mori, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 15/919,682

(22) Filed: Mar. 13, 2018

(65) Prior Publication Data

US 2019/0088452 A1 Mar. 21, 2019

(30) Foreign Application Priority Data

Sep. 20, 2017 (JP) ................................. 2017-179665

(51) Int. Cl.
*H01J 37/32* (2006.01)
*H01L 21/67* (2006.01)

(52) U.S. Cl.
CPC ........ *H01J 37/3299* (2013.01); *H01J 37/321* (2013.01); *H01L 21/67069* (2013.01);
(Continued)

(58) Field of Classification Search
CPC ................ H01J 37/3299; H01J 37/321; H01J 2237/334; H01J 2237/24514;
(Continued)

(56) References Cited

U.S. PATENT DOCUMENTS 8,980,049 B2 * 3/2015 Lee ................... H01L 21/67069
118/723 IR
2009/0297404 A1 * 12/2009 Shannon ........... H01J 37/32082
422/108
(Continued)

FOREIGN PATENT DOCUMENTS

JP 2004-022822 A 1/2004
JP 2007-067037 A 3/2007
(Continued)

OTHER PUBLICATIONS

Office Action dated Dec. 17, 2018 for Korean Application No. 10-2017-0180657.

*Primary Examiner* — Edward Chin
(74) *Attorney, Agent, or Firm* — Miles & Stockbridge, P.C.

(57) ABSTRACT

According to one embodiment, a plasma processing apparatus includes a processing chamber, a sample stage that is disposed inside the processing chamber and electrically divided into a plurality of regions on which a sample is placed, an electromagnetic wave introduction unit that introduces electromagnetic waves into the processing chamber, and a bias power applying unit that applies bias power to the sample stage, in which the bias power applying unit is configured to include a first radio frequency power applying unit that applies first radio frequency power to a first region out of the plurality of electrically divided regions of the sample stage, a second radio frequency power applying unit that applies second radio frequency power to a second region out of the plurality of electrically divided regions of the sample stage, and a phase adjuster that controls the first radio frequency power applying unit and the second radio frequency power applying unit to shift the phases of the first (Continued)

radio frequency power and the second radio frequency power by a predetermined amount.

4 Claims, 4 Drawing Sheets

(52) U.S. Cl.
CPC .. *H01L 21/67253* (2013.01); *H01J 37/32183* (2013.01); *H01J 2237/24514* (2013.01); *H01J 2237/334* (2013.01)

(58) Field of Classification Search
CPC ......... H01J 37/32183; H01L 21/67069; H01L 21/67253
See application file for complete search history.

(56) References Cited

U.S. PATENT DOCUMENTS

| | | | |
|---|---|---|---|
| 2011/0253672 A1 | 10/2011 | Kamibayashi et al. | |
| 2017/0169996 A1* | 6/2017 | Ui ..................... | H01J 37/32091 |

FOREIGN PATENT DOCUMENTS

| | | | | |
|---|---|---|---|---|
| JP | 2007-441769 | * | 3/2007 | ......... H01L 21/3065 |
| JP | 2011-017076 A | | 1/2011 | |
| KR | 2011-0116955 A | | 10/2011 | |
| KR | 2014-0040640 A | | 4/2014 | |

* cited by examiner

PLASMA PROCESSING APPARATUS AND PLASMA PROCESSING METHOD

CLAIM OF PRIORITY

The present application claims priority from Japanese Patent Application JP 2017-179665 filed on Sep. 20, 2017, the content of which is hereby incorporated by reference into this application.

BACKGROUND OF THE INVENTION

Field of the Invention

The present invention relates to a plasma processing apparatus including a processing chamber inside a vacuum container and a sample stage disposed inside the processing chamber and having a substrate-like sample such as a semiconductor wafer placed on the upper surface thereof, and a plasma processing method of processing the sample by supplying a radio frequency power to an electrode disposed inside the sample stage while forming a plasma in the processing chamber.

Background Art

In a plasma etching apparatus that processes a sample such as a semiconductor element with plasma generated in a processing chamber, for example, as described in JP-A-2007-67037 and JP-A-2004-22822, a method is known in which a plurality of concentrically formed substrate electrodes are used to apply radio frequency bias power to the substrate electrodes in a state in which plasma is generated to etch a fine pattern with high accuracy.

SUMMARY OF THE INVENTION

JP-A-2007-67037 describes that, in a plasma processing apparatus that processes a sample by using a sample stage which is an electrode concentrically divided into two, RADIO FREQUENCY bias power to be applied from two radio frequency as bias power sources are independently controlled on a sample stage block on the center side of a sample stage which is an electrode and on a sample stage block on the outer peripheral side thereof.

In addition, JP-A-2004-22822 describes a configuration in which, in a plasma processing apparatus that processes a sample by using an electrode table concentrically divided into two as an inner stage on the center side and an outer stage on the outer peripheral side, the phases of the respective radio frequency power supplied from the two radio frequency bias power sources are applied to the inner stage and the outer stage of the electrode table with the same phase. By applying the same radio frequency power with the same phase and giving a difference between the power of each of the inner stage and the outer stage, it is possible to make a difference between the inner stage and the outer stage of the peak-to-peak voltage (hereinafter, referred to as $V_{pp}$) of the radio frequency power applied to the sample on the electrode table.

However, applying the power from the two radio frequency bias power sources to the sample has the following two problems.

First, as described in JP-A-2004-22822, when the outputs of the two radio frequency bias power sources are supplied to the inner stage and the outer stage of the electrode table and a difference is to be given between the center side and the outer peripheral side of the $V_{pp}$ applied to the sample, and in a case where the phases of the outputs from the respective radio frequency bias power sources are the same, it is necessary to increase the output difference between the two radio frequency bias power sources, and there is a problem that a radio frequency bias power source having a large rated output is required for one radio frequency bias power source.

In addition, even in a case where the outputs of the two radio frequency bias power sources are to be made the same by an external phase control device, when there is a difference in the way of phase rotation in each bias power source, there is a problem that the radio frequency power actually applied to the inner stage and the outer stage of the electrode table does not become the same phase.

In addition, in the configuration disclosed in JP-A-2007-67037, a current flows between the electrodes of the divided sample stage block on the center side and the sample stage block on the outer peripheral side, and the inter-electrode circuits causing the voltage difference is insufficient, thus there is a problem that it is impossible to make a sufficient difference in $V_{pp}$ between the electrodes.

An object of the present invention is to solve the problems of the related art described above and to provide a plasma processing apparatus and a plasma processing method capable of improving the uniformity of sample processing and reducing cost.

In order to solve the above problem, according to the present invention, there is provided a plasma processing apparatus including a processing chamber in which a sample is subject to plasma processing, a radio frequency power source that supplies radio frequency power for generating plasma, a sample stage that has a first region and a second region which are electrically divided from each other and on which the sample is placed, a first radio frequency power source that supplies first radio frequency power to the first region, a second radio frequency power source that supplies second radio frequency power to the second region, a control device that controls a phase difference which is a difference between a phase of the first radio frequency power and a phase of the second radio frequency power, and an inter-electrode circuit portion that is disposed between a first transmission path for supplying the first radio frequency power to the first region and a second transmission path for supplying the second radio frequency power to the second region, in which one connection portion of the inter-electrode circuit portion is connected between the sample stage and a matching unit of the first radio frequency power source, the other connection portion of the inter-electrode circuit portion is connected between the sample stage and a matching unit of the second radio frequency power source, and the control device controls the phase difference so that a voltage difference, which is a difference between a peak-to-peak voltage of a radio frequency voltage applied to the first region and a peak-to-peak voltage of a radio frequency voltage applied to the second region, has a predetermined value.

In addition, in order to solve the above problem, according to the present invention, there is provided a plasma processing method using a plasma processing apparatus including a processing chamber in which a sample is subject to plasma processing, a radio frequency power source that supplies radio frequency power for generating plasma, a sample stage that has a first region and a second region which are electrically divided from each other and on which the sample is placed, a first radio frequency power source that supplies first radio frequency power to the first region, a second radio frequency power source that supplies second radio frequency power to the second region, a control device that controls a phase difference which is a difference between a phase of the first radio frequency power and a phase of the second radio frequency power, and an inter-electrode circuit portion that is disposed between a first transmission path for supplying the first radio frequency power to the first region and a second transmission path for supplying the second radio frequency power to the second region, in which one connection portion of the inter-electrode circuit portion is connected between the sample stage and a matching unit of the first radio frequency power source, the other connection portion of the inter-electrode circuit portion is connected between the sample stage and a matching unit of the second radio frequency power source, and the method including controlling the phase difference so that a voltage difference, which is a difference between a peak-to-peak voltage of a radio frequency voltage applied to the first region and a peak-to-peak voltage of a radio frequency voltage applied to the second region, has a predetermined value.

According to the present invention, it is possible to improve the uniformity of the etching rate from the center portion to the outer peripheral portion of a wafer by using a radio frequency bias power source having a comparatively small rated output, thereby reducing the cost of a plasma processing apparatus.

DETAILED DESCRIPTION OF THE INVENTION

The present invention relates to a plasma processing apparatus and a plasma processing method capable of improving the uniformity of processing of samples with a relatively inexpensive configuration.

In the present invention, an inter-electrode circuit is provided between the radio frequency power applying circuits for respectively applying radio frequency power to an inner electrode and an outer electrode, which constitute a sample stage on which a sample is placed, and the phase difference between the radio frequency power respectively applied to the inner electrode and the outer electrode may be controlled.

In this manner, the difference in $V_{pp}$ between the inner electrode and the outer electrode may be controlled by controlling the phase difference of the radio frequency power applied to the inner electrode and the outer electrode without using a radio frequency power source having a large rated output.

As a result, according to the present invention, it is possible to control the $V_{pp}$ distribution in the plane of the wafer placed on the sample stage and to improve the uniformity of the etching rate from the central portion to the outer peripheral portion of the wafer by using a radio frequency bias power source having a smaller rated output.

An example of the present invention will be described below with reference to drawings.

Example 1

Figure 1:
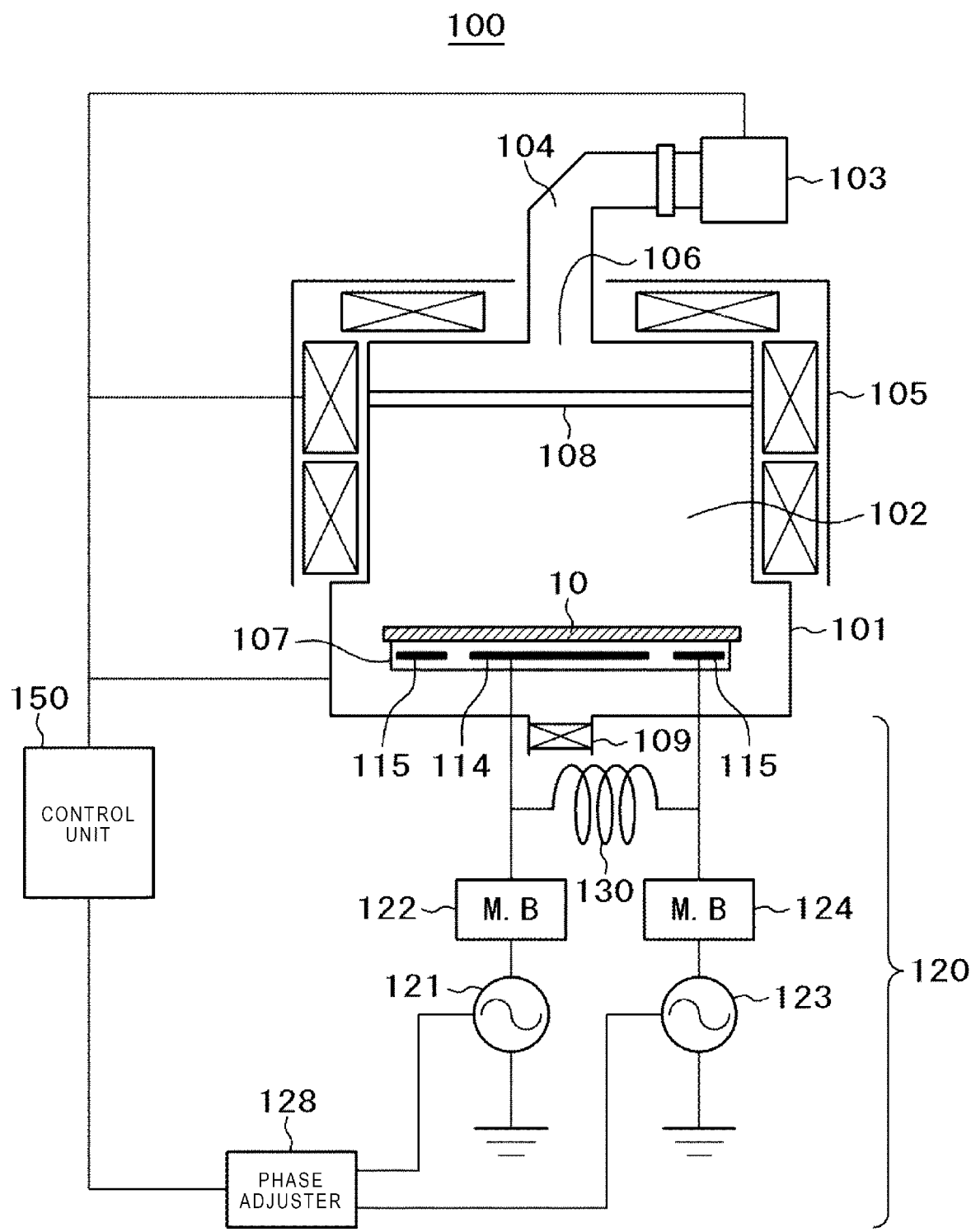
FIG. 1 is a longitudinal sectional diagram schematically showing the outline of a configuration of a plasma processing apparatus according to Example 1 of the present invention.

A first embodiment of the present invention will be described with reference to FIGS. 1 to 3. FIG. 1 is a diagram showing a schematic configuration of a longitudinal section of a microwave plasma etching apparatus (hereinafter, referred to as an etching apparatus) 100 of an electron cyclotron resonance (ECR) system as an example of a plasma processing apparatus according to the present example.

The etching apparatus 100 according to the present example controls a vacuum container 101, a power source for generating electromagnetic waves 103 which is a radio frequency power source for plasma generation, a waveguide 104, a magnetic-field generating coil 105, a sample placing electrode 107, a radio frequency bias power applying circuit portion 120, and a control unit 150 for controlling the whole.

A dielectric window 108 is installed on the top of the vacuum container 101 to seal the interior of the vacuum container 101 to form a processing chamber 102. In the processing chamber 102, a gas supply device (not shown) for flowing etching gas used for etching processing of a wafer 10 as a sample is connected. In addition, a vacuum evacuation device (not shown) is connected to the vacuum container 101 via an exhaust on/off valve 109.

In the processing chamber 102, the exhaust on/off valve 109 is opened, and the vacuum evacuation device is driven to reduce the pressure to a vacuum state. The etching gas is introduced into the processing chamber 102 from a gas supply device (not shown) and evacuated by a vacuum evacuation device (not shown).

The sample placing electrode 107, which is a sample stage, is provided in the lower part of the vacuum container 101 in the processing chamber 102, facing the dielectric window 108.

The electromagnetic waves oscillated by the power source for generating electromagnetic waves 103, which is a radio frequency power source for plasma generation, is transmitted to the waveguide 104. The waveguide 104 transmits the electromagnetic waves to the inside of the vacuum container 101 from an opening portion 106 formed in the upper part of the vacuum container 101. The electromagnetic waves transmitted inside the vacuum container 101 pass through the dielectric window 108 and are supplied into the processing chamber 102. The effect of the present example is not particularly limited to the frequency of electromagnetic waves, but in the present example, microwaves of 2.45 GHz are used.

The magnetic-field generating coil 105 forms a magnetic field having an intensity such that an ECR condition is established with respect to the electromagnetic waves transmitted from the opening portion 106 in the vicinity of the dielectric window 108 at the upper part of the processing chamber 102 of the vacuum container 101.

The electromagnetic waves oscillated from the power source for generating electromagnetic waves 103 generate a high-density plasma in the processing chamber 102 by interaction with a magnetic field having such intensity as to satisfy the ECR condition formed in the vicinity of the dielectric window 108 by the magnetic-field generating coil 105. With this generated high-density plasma, etching treatment is applied to the wafer 10 which is a sample disposed on the sample placing electrode 107.

Since the sample placing electrode 107, the magnetic-field generating coil 105, the exhaust on/off valve 109, and the wafer 10 placed on the sample placing electrode 107 are coaxially disposed on the central axis of the processing chamber 102, the flow of the etching gas, the radicals and ions generated by the plasma, and the reaction products generated by the etching are coaxially introduced and exhausted to the wafer 10. This coaxial arrangement has an effect of bringing the etching rate and the in-wafer uniformity of the etching shape closer to axisymmetry and improving wafer processing uniformity.

The sample placing electrode 107 is provided with a center electrode 114 which is a film-shaped electrode disposed on the center side inside a dielectric film (not shown), and an outer electrode 115 which is a membrane-like electrode disposed on the outer peripheral side thereof and formed into a ring shape. The center electrode 114 and the outer electrode 115 to which the radio frequency power is applied are electrically connected to the wafer 10 placed on the sample placing electrode 107.

In the center electrode 114, a first radio frequency bias power source 121 of the radio frequency bias power applying circuit portion 120 is connected via a first matching circuit 122. By applying radio frequency power from the first radio frequency bias power source 121 to the center electrode 114 via the first matching circuit 122, an electric field for drawing ions into the center of the wafer 10 placed on the sample placing electrode 107 is formed.

A second radio frequency bias power source 123 of the radio frequency bias power applying circuit portion 120 is connected to the outer electrode 115 via a second matching circuit 124. By applying radio frequency power from the second radio frequency bias power source 123 to the outer electrode 115 via the second matching circuit 124, an electric field for drawing ions to the outer peripheral of the wafer 10 placed on the sample placing electrode 107 is formed.

In addition, the center electrode 114 to which the radio frequency power is applied and the outer electrode 115 are connected by an inter-electrode circuit 130. By this inter-electrode circuit 130, a current flows between the center electrode 114 and the outer electrode 115, and a potential difference is generated between the center electrode 114 and the outer electrode 115. In the present example, a coil is used as the inter-electrode circuit 130 so as to form inductance with respect to radio frequency power.

In the present example, by providing the inter-electrode circuit 130 in this manner, the current flowing between the inner electrode and the outer electrode is defined, and the $V_{pp}$ difference may be controlled by controlling the phase difference between the radio frequency power applied to the inner electrode and the outer electrode, respectively.

The effect of the present example is not particularly limited to the frequency of the radio frequency bias power output from the first radio frequency bias power source 121 and the second radio frequency bias power source 123, but in the present example, radio frequency power of 400 kHz is used.

Figure 2:
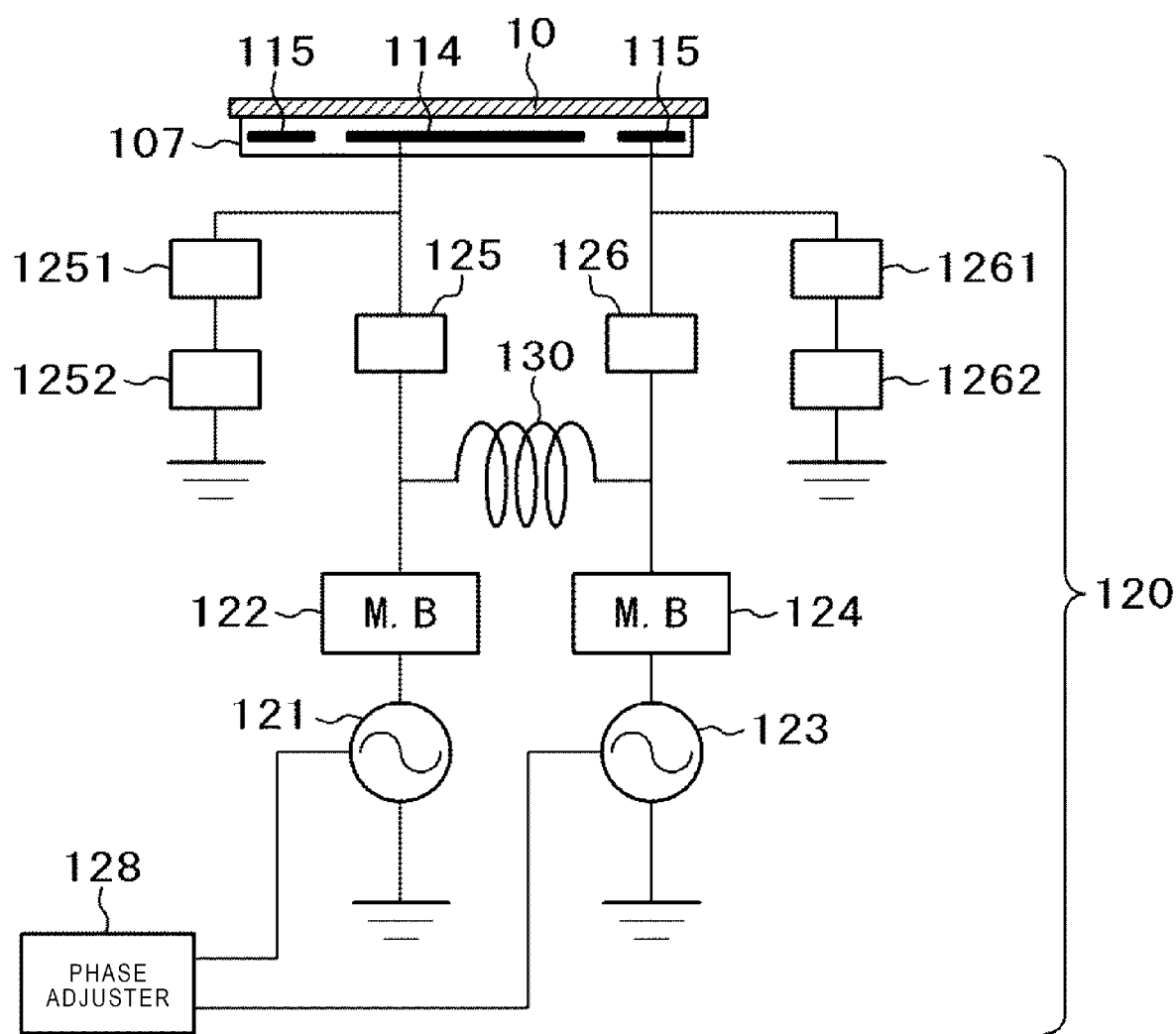
FIG. 2 is a block diagram showing details of a configuration of a radio frequency bias power applying circuit of the plasma processing apparatus according to Example 1 of the present invention.

Referring to FIG. 2, the circuit configuration of the radio frequency bias power applying circuit portion 120 connected to the sample placing electrode 107 of the present example will be described in more detail.

A first DC cut filter circuit 125 is connected between the center electrode 114 and the first matching circuit 122, and a first DC power source 1252 is connected between the first DC cut filter circuit 125 and the center electrode 114 via a first radio frequency cut filter 1251. The first DC cut filter circuit 125 is provided so that a DC voltage is applied to the first radio frequency bias power source 121 and the first matching circuit 122 so as not to be damaged. The first radio frequency cut filter 1251 is provided so that radio frequency power that is bias power is applied to the first DC power source 1252 so as not to be damaged.

Similarly, a second DC cut filter circuit 126 is connected between the outer electrode 115 and the second matching circuit 124, and the second DC power source 1262 is connected between the second DC cut filter circuit 126 and the outer electrode 115 via a second radio frequency cut filter 1261. The second DC cut filter circuit 126 is provided so that a DC voltage is applied to the second radio frequency bias power source 123 and the second matching circuit 124 so as not to be damaged. The second radio frequency cut filter 1261 is provided so that radio frequency power that is bias power is applied to the second DC power source 1262 so as not to be damaged. By applying DC voltages of different polarities from the first DC power source 1252 and the second DC power source 1262 to the center electrode 114 and the outer electrode 115, dielectric polarization is generated with a dielectric film covering the center electrode 114 and a dielectric film covering the outer electrode 115. By generating dielectric polarization in this manner, the wafer 10 placed on the upper surface of the dielectric film covering the center electrode 114 and the dielectric film covering the outer electrode 115 is adsorbed by the electrostatic force in the dielectric film covering the center electrode 114 and on the upper surface of the dielectric film covering the outer electrode 115 (electrostatic adsorption) and held on the sample placing electrode 107.

The first matching circuit 122 and the first DC cut filter circuit 125, and the second matching circuit 124 and the second DC cut filter circuit 126 are connected by an inter-electrode circuit 130.

Further, a phase adjuster 128 is connected to the first radio frequency bias power source 121 and the second radio frequency bias power source 123.

Next, a method of controlling the $V_{pp}$ of the radio frequency power applied to the center side and the outer peripheral side of the wafer 10 in the present example will be described with reference to FIG. 3.

Figure 3:
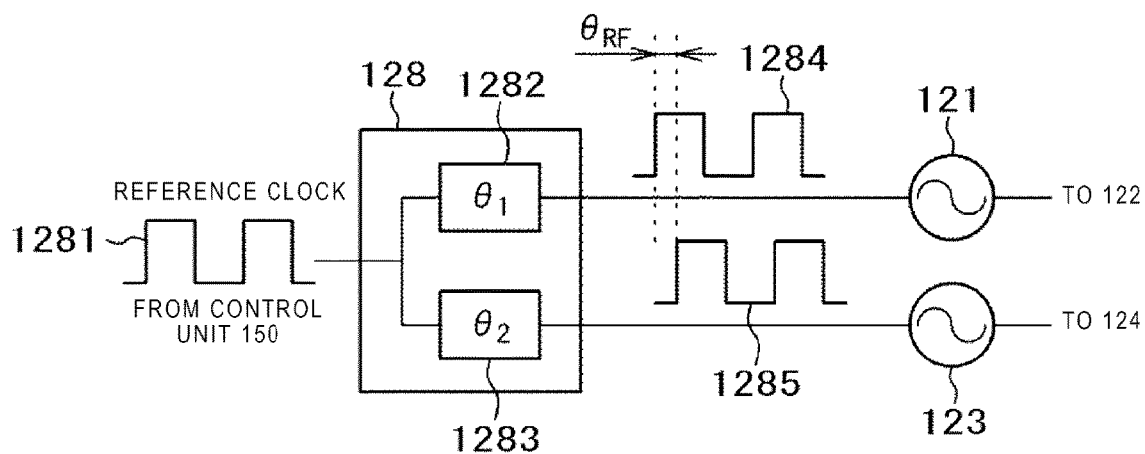
FIG. 3 is a block diagram showing a configuration of a phase adjuster of the radio frequency bias power applying circuit according to Example 1 of the present invention.

FIG. 3 is a diagram showing phase control by the phase adjuster 128 shown in FIG. 2. A reference clock 1281 (for example, a square wave of 400 kHz) is input to the phase adjuster 128 from the control unit 150. A signal 1284 having no phase difference from the reference clock 1281 is output from a first phase signal generator 1282 inside the phase adjuster 128 in synchronization with the reference clock 1281 and input to the first radio frequency bias power source 121.

On the other hand, a signal 1285 having a phase difference of $\theta_{RF}$ with respect to the reference clock 1281 is output from a second phase signal generator 1283 inside the phase adjuster 128 in synchronization with the reference clock 1281 and input to the second radio frequency bias power source 123.

Since the first radio frequency bias power source 121 and the second radio frequency bias power source 123 oscillate the power to be output to the center electrode 114 and the outer electrode 115 based on the signal input from the phase adjuster 128, a phase difference of $\theta_{RF}$ is generated between the outputs.

In the circuit of the present example, a voltage $V_{IN}$ applied to the center side of the wafer 10 by the center electrode 114 connected to the first radio frequency bias power source 121 is expressed by equation (1).

$$V_{IN}=\sqrt{V_a^2+V_b^2+2V_aV_b\cos(\theta_{RF}+\theta_\alpha)} \quad (1)$$

In addition, a voltage $V_{OUT}$ applied to the outer peripheral side of the wafer 10 by the outer electrode 115 connected to the second radio frequency bias power source 123 is expressed by equation (2).

$$V_{OUT}=\sqrt{V_a^2+V_b^2+2V_aV_b\cos(\theta_{RF}+\theta_\alpha)} \quad (1)$$

In each of $V_{IN}$ and $V_{OUT}$, $\theta_{RF}$ is included in cos, and the sign of $\theta_\alpha$ of each cos term is reversed. In general, since the value of $\theta_\alpha$ is not 0, there is a difference between $V_{pp}$ (=$2V_{IN}$) on the center side and $V_{pp}$ (=$2V_{OUT}$) on the outer peripheral side.

Figure 4:
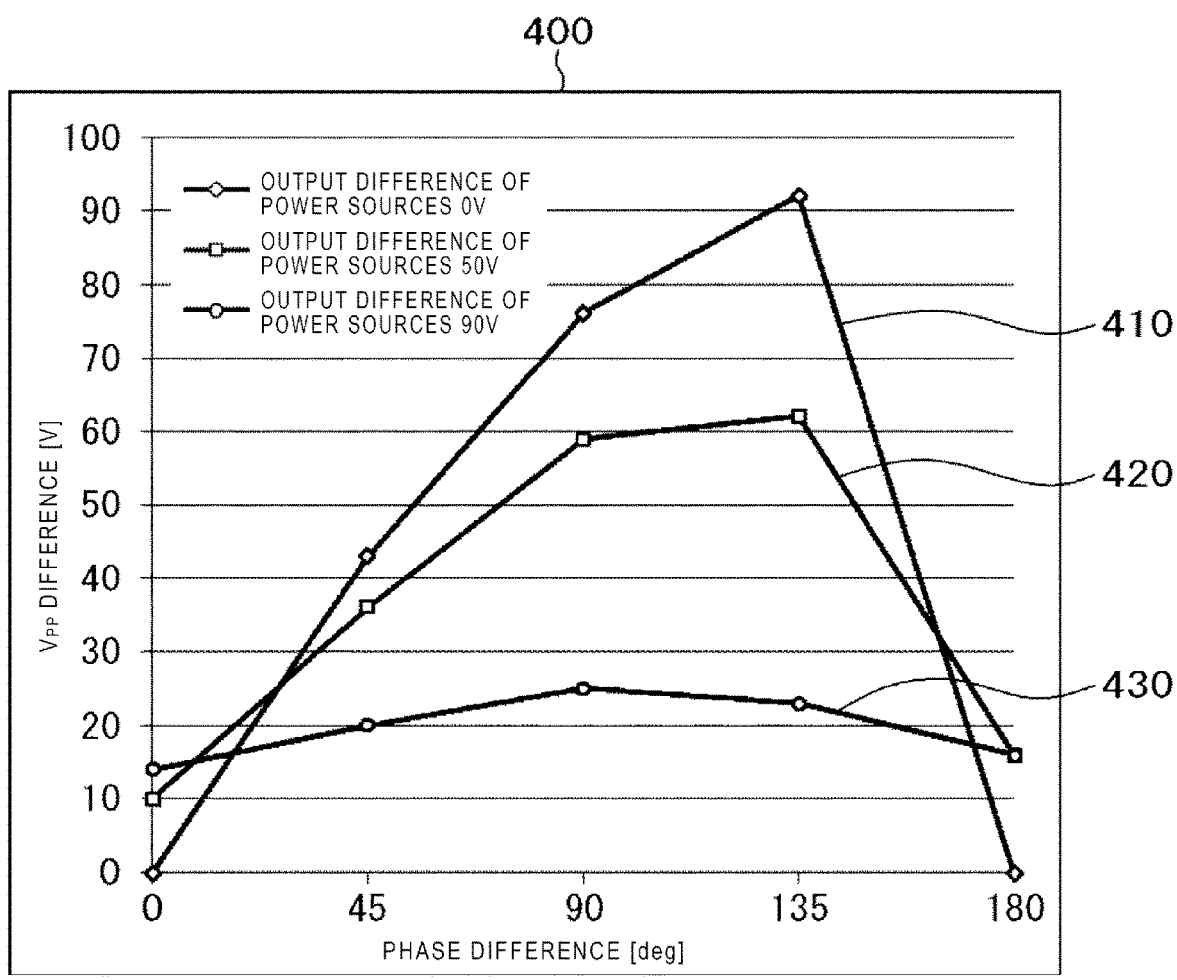
FIG. 4 is a graph showing a relationship between a phase difference of a radio frequency bias power applied to a wafer obtained by a circuit simulator and a difference in $V_{pp}$ generated in a plane of the wafer based on the radio frequency bias power applying circuit in Example 1 of the present invention.

FIG. 4 shows a graph in which the difference in $V_{pp}$ between the center side and the outer peripheral side of the wafer 10 placed on the sample placing electrode 107 is obtained by the circuit simulator. The graph 400 of FIG. 4 shows data 410 when the difference between the output voltages of the first radio frequency bias power source 121 and the second radio frequency bias power source 123 is 0 V, data 420 at 50 V, and data 430 at 90 V.

From the result shown in FIG. 4, it is understood that the amount of change in $V_{pp}$ with respect to the change in phase difference is larger in the data 410 when the difference between the output voltages of the first radio frequency bias power source 121 and the second radio frequency bias power source 123 is 0 V, than in the other data 420 and 430 the data 410. In addition, in the data 410 when the difference between the output voltages of the first radio frequency bias power source 121 and the second radio frequency bias power source 123 is 0 V, as compared with the case where the phase difference is 0 degrees, the difference in $V_{pp}$ is larger when the phase difference is 135 degrees. In addition, the constant (in the case of the present example, the inductance of the coil constituting the inter-electrode circuit 130) of the inter-electrode circuit 130 may not be fixed, and in a case where the constant is changed, the distribution of the $V_{pp}$ difference applied to the wafer becomes different from the result shown in FIG. 4.

From this result, in the configuration of the radio frequency bias power applying circuit portion 120 in the present example as shown in FIGS. 2 and 3, by setting the difference between the output power of the first radio frequency bias power source 121 and the second radio frequency bias power source 123 and the phase difference to appropriate values by the control unit 150, it is understood that the adjustment range of the $V_{pp}$ difference between the center side and the outer peripheral side of the wafer 10 may be made larger as compared with the case where no phase difference is given.

According to the present example, in a state where an inter-electrode circuit is formed between the radio frequency power applying circuits, by controlling the phase difference between the first radio frequency bias power source 121 and the second radio frequency bias power source 123 to apply radio frequency power having a phase difference in the inner electrode and the outer electrode constituting the sample stage on which the sample is placed, it is possible to control the difference in $V_{pp}$ applied to the inner electrode and the outer electrode, respectively.

In this manner, it is possible to reliably control the difference in $V_{pp}$ between the inner electrode and the outer electrode by reliably controlling the output difference and the phase difference of the radio frequency power applied to the inner electrode and the outer electrode without using a radio frequency power source having a large rated output.

As a result, according to the present example, it is possible to control the $V_{pp}$ distribution in the plane of the wafer placed on the sample stage, and by using a plurality of radio frequency bias power sources having comparatively small rated outputs, it is possible to improve the uniformity of the etching rate from the center portion to the outer peripheral portion of the wafer.

In this manner, it is possible to improve the uniformity of the etching rate from the central portion to the peripheral portion of the wafer and it is possible to reduce the cost of the plasma processing apparatus by using the radio frequency bias power source having a comparatively small rated output.

Example 2

Figure 5:
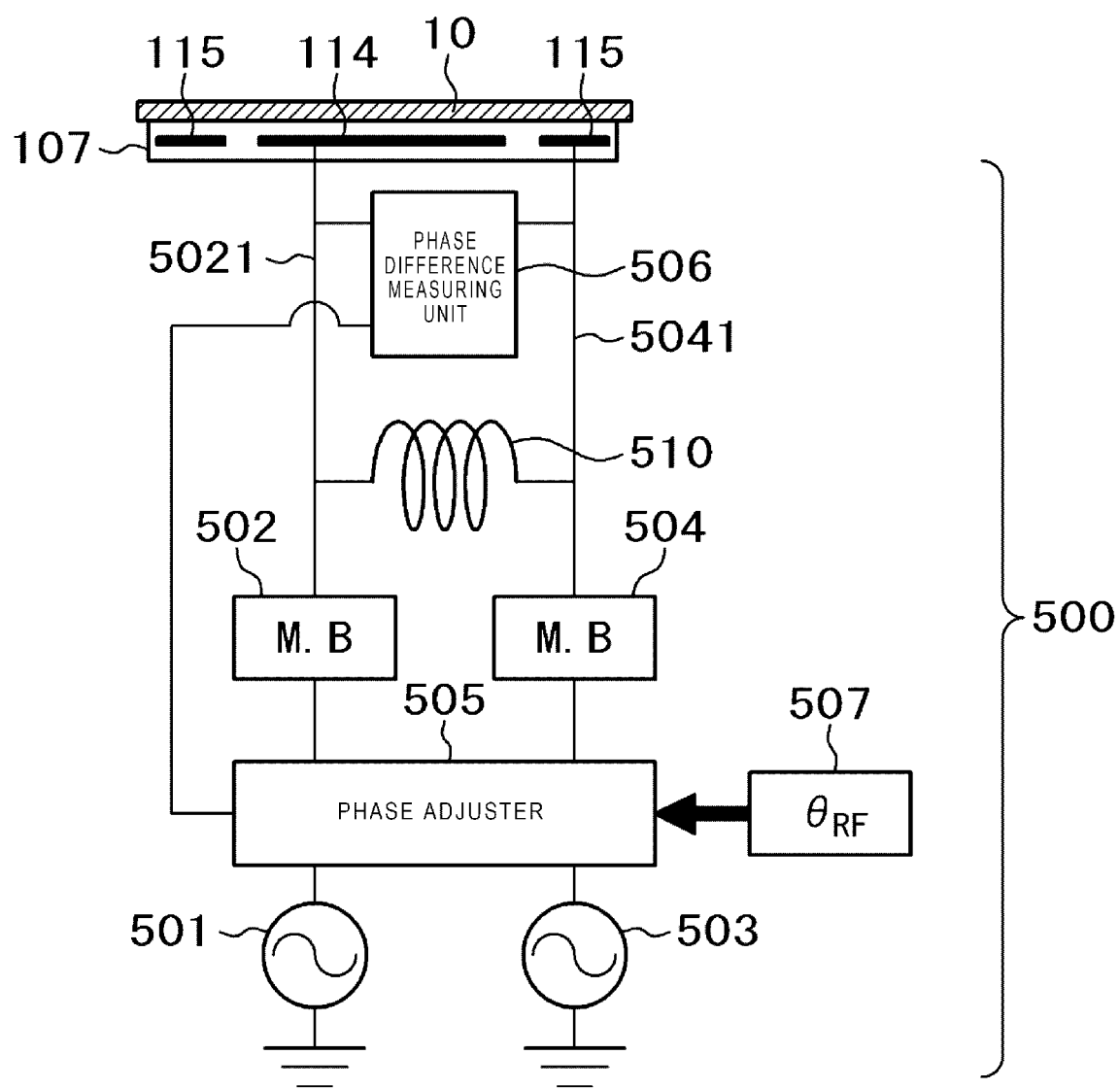
FIG. 5 is a block diagram showing a configuration of a radio frequency bias power applying circuit of a plasma processing apparatus according to Example 2 of the present invention.

A second example of the present invention will be described with reference to FIG. 5. In the present example, the radio frequency bias power applying circuit portion 120 in the etching apparatus 100 shown in FIG. 1 in Example 1 is replaced with a radio frequency bias power applying circuit portion 500 as shown in FIG. 5. Except for the radio frequency bias power applying circuit portion 500, the configuration is the same as that of Example 1, thus the illustration and repetitive description thereof will be omitted.

The radio frequency bias power applying circuit portion 500 according to the present example shown in FIG. 5 measures a phase difference between the center electrode 114 and the outer electrode 115 to automatically adjust the phase difference of the radio frequency power output from the two bias power sources.

In the radio frequency bias power applying circuit portion 500 according to the present example shown in FIG. 5, a phase adjuster 505 is connected between a first radio frequency bias power source 501 and a first matching circuit 502, and between a second radio frequency bias power source 503 and a second matching circuit 504.

Further, a phase difference measuring unit 506 is connected between a line 5021 connecting the first matching circuit 502 and the center electrode 114 and a line 5041 connecting the second matching circuit 504 and the outer electrode 115. In addition, an inter-electrode circuit 510 is provided between the first matching circuit 502 and the second matching circuit 504 and the phase difference measuring unit 506 to connect the output from the first matching circuit 502 and the output from the second matching circuit 504.

Next, in the configuration shown in FIG. 5, in Example 1, plasma is generated inside the vacuum container 101 in a state where the wafer 10 which is a sample is placed on the sample placing electrode 107 inside the vacuum container 101 described with reference to FIG. 1, radio frequency bias power is respectively applied to the center electrode 114 and the outer electrode 115 of the sample placing electrode 107 from the first radio frequency bias power source 501 and the second radio frequency bias power source 503.

In this state, the phase difference between the radio frequency power applied to the center electrode 114 and the radio frequency power applied to the outer electrode 115 is measured by the phase difference measuring unit 506. The phase difference signal measured by the phase difference measuring unit 506 is input to the phase adjuster 505.

In the phase adjuster 505, the phase difference signal input from the phase difference measuring unit 506 is compared with the setting value: $\theta_{RF}$ of the phase difference signal input from the phase difference signal setting unit 507, as described with reference to FIG. 3 in Example 1, the phase of the radio frequency power output from the first radio frequency bias power source 501 and the phase of the radio frequency power output from the second radio frequency bias power source 503 are adjusted so that the difference between both phase difference signals becomes zero. As described above, according to the present example, based on the information on the phase difference between the radio frequency power applied to the center electrode 114 and the radio frequency power applied to the outer electrode 115 measured by the phase difference measuring unit 506 detected during the etching process and the difference between a preset phase difference signal setting value: $\theta_{RF}$ in the phase difference signal setting unit 507, it is possible to adjust the difference between the phase of the radio frequency power output from the first radio frequency bias power source 501 and the phase of the radio frequency power output from the second radio frequency bias power source 503 in the phase adjuster 505.

In this manner, during the etching process of the wafer 10, the phase difference between the radio frequency power applied to the center electrode 114 and the radio frequency power applied to the outer electrode 115 may be maintained at a value set by the phase difference signal setting unit 507.

As a result, according to the present example, during the etching process of the wafer placed on the sample placing electrode, it is possible to control the $V_{pp}$ distribution in the plane of the wafer, a radio frequency bias power source having a relatively large rated output is not required, and it is possible to improve the uniformity of the etching rate from the central portion to the peripheral portion of the wafer by using a plurality of radio frequency bias power sources having relatively small rated outputs.

In this manner, it is possible to improve the uniformity of the etching rate from the central portion to the peripheral portion of the wafer and it is possible to reduce the cost of the plasma processing apparatus by using the radio frequency bias power source having a comparatively small rated output.

Although the invention made by the present inventor has been concretely described based on an example, it is needless to say that the present invention is not limited to the examples described above, and various modifications can be made without departing from the gist thereof. For example, the above-described examples have been described in detail in order to explain the present invention in an easy-to-understand manner, and is not necessarily limited to having all the configurations described. In addition, it is possible to add, delete, and replace other configurations for part of the configuration of each example.

What is claimed is:

1. A plasma processing apparatus comprising:
   a processing chamber in which a sample is subject to plasma processing;
   a radio frequency power source that supplies radio frequency power for generating plasma;
   a sample stage that includes a first region and a second region which are electrically divided from each other and on which the sample is placed, the first region comprising a center electrode and the second region comprising a ring-shaped outer electrode disposed at an outer peripheral side of said center electrode;
   a first radio frequency power source that supplies first radio frequency power to the first region;
   a second radio frequency power source that supplies second radio frequency power to the second region;
   a control device that controls a phase difference which is a difference between a phase of the first radio frequency power and a phase of the second radio frequency power; and
   an inter-electrode circuit portion that is disposed between a first transmission path for supplying the first radio frequency power to the first region and a second transmission path for supplying the second radio frequency power to the second region,
   wherein one connection portion of the inter-electrode circuit portion is connected between the sample stage and a matching unit of the first radio frequency power source,
   the other connection portion of the inter-electrode circuit portion is connected between the sample stage and a matching unit of the second radio frequency power source, and
   the control device controls the phase difference so that a voltage difference, which is a difference between a peak-to-peak voltage of a radio frequency voltage applied to the first region and a peak-to-peak voltage of a radio frequency voltage applied to the second region has a peak-to-peak voltage adjustment range that is greater than a peak-to-peak voltage adjustment range in an absence of the phase difference.

2. The plasma processing apparatus according to claim 1, wherein the inter-electrode circuit portion includes an inductance.

3. The plasma processing apparatus according to claim 1, further comprising:
   a first monitor unit that monitors a phase of the first radio frequency power between the one connection portion and the sample stage; and
   a second monitor unit that monitors a phase of the second radio frequency power between the other connection portion and the sample stage,
   wherein the control device controls the phase difference based on the phase monitored by the first monitor unit, the phase monitored by the second monitor unit, and the predetermined value.

4. The plasma processing apparatus according to claim 1, wherein the control device controls the phase difference such that the phase difference becomes a phase difference corresponding to the predetermined value obtained based on a correlationship between the voltage difference and the phase difference.

* * * * *